US012586758B2

(12) United States Patent
Heckman

(10) Patent No.: US 12,586,758 B2
(45) Date of Patent: Mar. 24, 2026

(54) POWER DELIVERY TO A PLASMA VIA INDUCTIVE COUPLING

(71) Applicant: Advanced Energy Industries, Inc., Denver, CO (US)

(72) Inventor: Randy Heckman, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 82 days.

(21) Appl. No.: 18/828,962

(22) Filed: Sep. 9, 2024

(65) Prior Publication Data

US 2025/0006460 A1    Jan. 2, 2025

Related U.S. Application Data

(63) Continuation of application No. 17/580,257, filed on Jan. 20, 2022, now Pat. No. 12,106,937.

(60) Provisional application No. 63/139,488, filed on Jan. 20, 2021.

(51) Int. Cl.
*H01J 37/32* (2006.01)

(52) U.S. Cl.
CPC ...... *H01J 37/321* (2013.01); *H01J 37/32183* (2013.01)

(58) Field of Classification Search
CPC ......................... H01J 37/321; H01J 37/32183
See application file for complete search history.

(56) References Cited

U.S. PATENT DOCUMENTS

| | | | |
|---|---|---|---|
| 6,156,667 A | 12/2000 | Jewett | |
| 6,291,938 B1 | 9/2001 | Jewett et al. | |
| 6,392,210 B1 | 5/2002 | Jewett et al. | |
| 6,507,155 B1 | 1/2003 | Barnes et al. | |
| 7,755,300 B2 | 7/2010 | Kishinevsky et al. | |
| 8,319,436 B2 | 11/2012 | Carter et al. | |
| 12,106,937 B2 | 10/2024 | Heckman | |
| 2001/0037857 A1 | 11/2001 | Kazumi et al. | |
| 2010/0194281 A1 | 8/2010 | Carter et al. | |
| 2014/0117861 A1 | 5/2014 | Finley et al. | |
| 2017/0062187 A1* | 3/2017 | Radomski | ......... H01J 37/32155 |
| 2019/0333740 A1 | 10/2019 | Bennett | |
| 2022/0230847 A1 | 7/2022 | Heckman | |

FOREIGN PATENT DOCUMENTS

WO          2019079325 A1      4/2019

OTHER PUBLICATIONS

Luong, Henry T, Office Action issued in U.S. Appl. No. 17/580,257, filed Mar. 20, 2024, 37 pages.
PCT, International Search Report and Written Opinion issued in PCT/US2022/013148, May 12, 2022, 10 pages.

* cited by examiner

*Primary Examiner* — Henry Luong
(74) *Attorney, Agent, or Firm* — NOD Law PC

(57) ABSTRACT

A power delivery system comprising a voltage source, an amplifier coupled to a first node and the voltage source, the amplifier comprising a reactive network configured to form a resonant circuit when the first node is coupled to a coil. The power delivery system also comprises an impedance coupled to a second node and a controller configured to control power to the first node by varying the voltage source and control power to the second node by adjusting the impedance.

20 Claims, 8 Drawing Sheets

(a) Variable capacitor    (b) Variable reactance    (c) Variable inductor

1006

301

Buck

Boost

Buck-Boost

POWER DELIVERY TO A PLASMA VIA INDUCTIVE COUPLING

CLAIM OF PRIORITY UNDER 35 U.S.C. § 119

The present Application for Patent is a Continuation of U.S. patent application Ser. No. 17/580,257 entitled "POWER DELIVERY TO A PLASMA VIA INDUCTIVE COUPLING" filed Jan. 20, 2022 which claims priority to Provisional Application No. 63/139,488 entitled "POWER DELIVERY TO A PLASMA VIA INDUCTIVE COUPLING" filed Jan. 20, 2021, and is assigned to the assignee hereof and hereby expressly incorporated by reference herein.

FIELD OF THE INVENTION

The present invention relates generally to plasma processing. In particular, but not by way of limitation, the present invention relates to systems, methods and apparatuses for applying and distributing power to inductively coupled plasmas.

BACKGROUND OF THE INVENTION

Inductively coupled plasma (ICP) processing systems are utilized to create high density plasmas at relatively low gas pressures and perform a variety of processes including etching, chemical vapor deposition, and gas abatement. In many implementations, inductive coil antennas are wound around a reactive chamber and actively driven by radio frequency (RF) power to prompt ignition of (and to maintain) a high density plasma in the chamber. In some implementations, multiple RF-powered inductively coupled coils may be used in the same reactive chamber to optimize ignition, increase plasma stability, adjust the etch or deposition profile, and extend the range of the process window.

There are many challenges and issues in typical ICP power systems such as cost, complexity, and precise control of RF power or current in one or more ICP coils to maintain a repeatable etch or deposition profile to achieve a desired uniformity.

Some existing power solutions utilize fixed frequency, 50 ohm, RF power sources that are each coupled to an ICP coil through separate RF match circuits. Challenges with these solutions include high costs; slow impedance matching tuning time (e.g., hundreds of milliseconds to several seconds); and non-repeatable power delivery run-to-run because power regulation at a 50 ohm point neglects variation of losses through an impedance matching network; thus, there is a variation of power delivered into the ICP coils to maintain a repeatable etch or deposition profile.

Other solutions use variable frequency, 50 ohm, RF power sources that are each coupled to an ICP coil through separate RF match circuits. Challenges with these solutions include high costs; variable frequency tuning time (e.g., hundreds of microseconds to tens of milliseconds); and non-repeatable power delivery run-to-run because power regulation at the 50 ohm point neglects variation of losses through an impedance matching network, thus, there is a variation in the power delivered into the ICP coils to maintain a repeatable etch or deposition profile.

In yet other solutions, a single fixed-frequency, 50 ohm, power source is coupled to multiple ICP coils through an RF match circuit whose output is reactively split to control a desired current through each of the coils, or a desired current ratio between each of the coils. In an alternate implementation, the ICP coils may be terminated by a tunable reactive circuit, allowing the magnetic coupling between multiple coils and their reactive terminations to control the magnitude of current flowing through each ICP coil, or a desired current ratio between each of the coils. But the challenges with these solutions include slow tuning time (e.g., hundreds of milliseconds to several seconds); limited range of current control between ICP coils; and maintaining good repeatability through a reactive current-splitting circuit to maintain a repeatable etch or deposition profile.

Variable frequency, direct-drive of one or more ICP coils has also been employed, but variable frequency tuning time may be slow for some process recipes (e.g., hundreds of microseconds to several milliseconds) and there are challenges with the accuracy and run-to-run repeatability of non-50 ohm power regulation at the input of the ICP coils.

SUMMARY

Aspects of the present disclosure may be characterized as a power delivery system comprising a voltage source, an amplifier coupled to a first node and the voltage source, the amplifier comprising a reactive network configured to form a resonant circuit when the first node is coupled to a coil. The power delivery system also comprises an impedance coupled to a second node and a controller configured to control power to the first node by varying the voltage source and control power to the second node by adjusting the impedance.

Another aspect of the present disclosure may be characterized as a method for power delivery comprising creating a resonant circuit by coupling an amplifier to first coil; inductively coupling power from the first coil to a second coil; controlling power to the first coil by adjusting a voltage applied to the amplifier; and controlling the power inductively coupled to the second coil by adjusting an impedance that is coupled to the second coil.

Yet another aspect may be characterized as a power delivery system comprising a first branch comprising a first voltage source and a first amplifier; a second branch comprising a second voltage source and a second amplifier; and at least one controller, wherein the controller is configured to maintain a different frequency for the first amplifier than a frequency of the second amplifier; control power of the first amplifier by varying the first voltage source; and control power of the second amplifier by varying the second voltage source.

DETAILED DESCRIPTION

Figure 1:
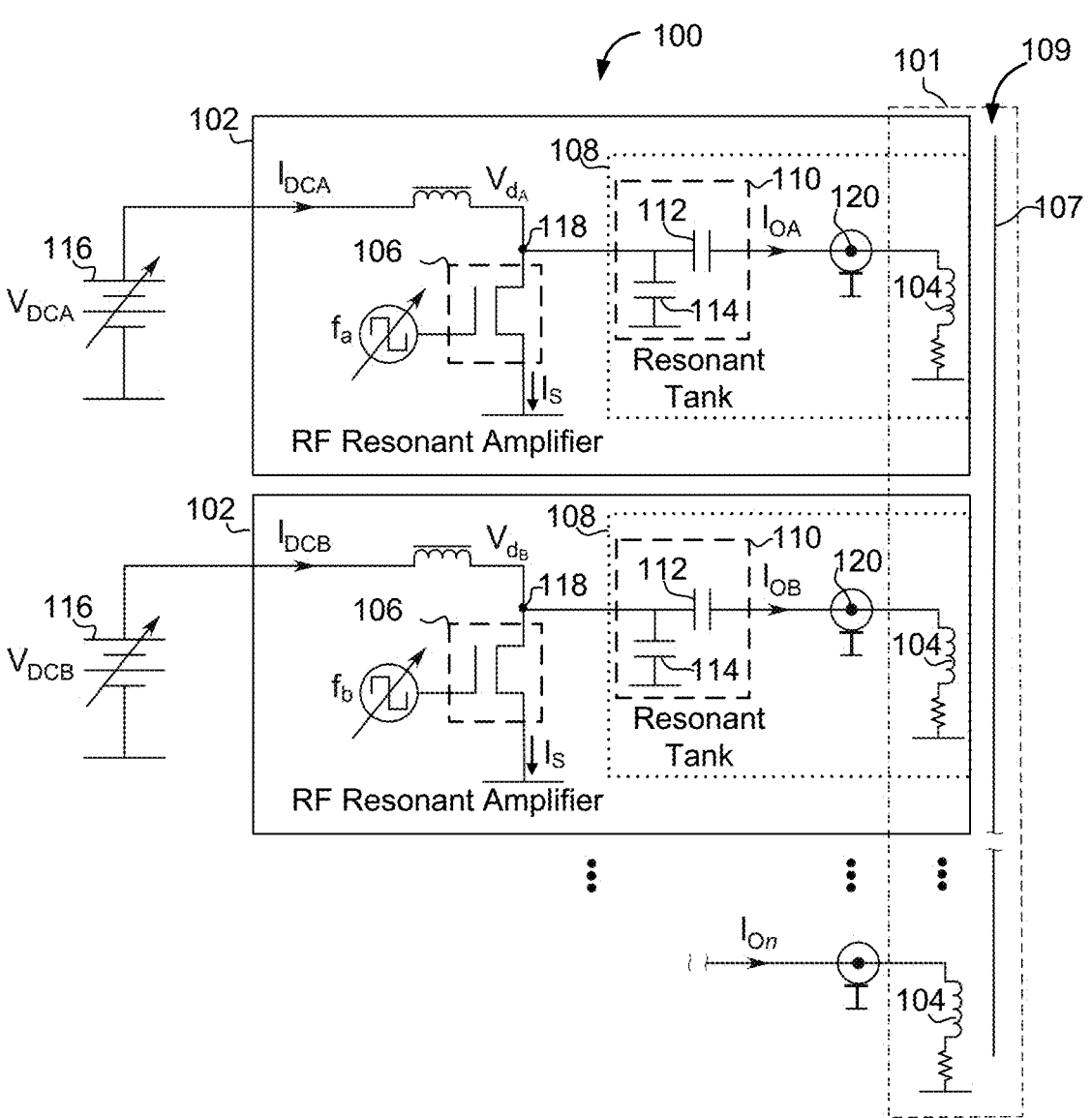
FIG. 1 is a schematic representation of an example of an ICP power delivery system.

Referring to the drawing figures, an aspect of many embodiments disclosed herein is a direct current (DC) controlled power amplifier (PA) that comprises a resonant tank that includes at least one ICP coil. Another aspect of many embodiments is that one or more PAs do not require impedance matching, signal filtering, and in the simplest case, do not require output RF metrology/sensors. For example, if the RF PA losses can be controlled (as discussed further herein), and therefore sufficiently approximated, power delivery into each ICP coil can be also be approximated by simply taking the product of the DC voltage of the DC supply and its output current.

To further simplify, some implementations (discussed further herein) utilize a lower cost/complexity, remote fixed-DC power supply, that would require only the RF PAs and a simplified DC/DC power converter, such as a DC buck circuit, to be mounted on the plasma chamber. Precise regulation of power or current into each ICP coil, or its approximation by taking the product of the DC voltage and current from the DC/DC power converter, may be used to enable control of field/deposition/etch uniformity.

These embodiments and methods, when combined with passive terminations (discussed further herein) to undriven ICP coils that are inductively coupled to a primary driven coil, may also further simplify the solutions. Regulation of any differences of current between the multiple ICP coils may be effectuated by accurate measurement, and control of current through each coil may be made by changing the terminating impedance to each undriven coil to control uniformity.

Figure 10:
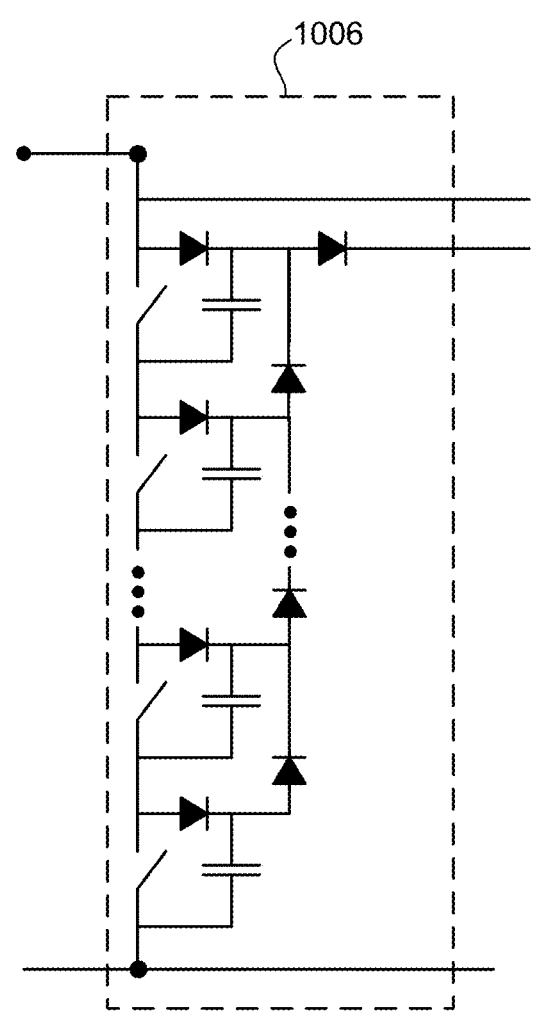
FIG. 10 is a schematic diagram depicting an example of a switch network that may be used to realize the switch networks disclosed herein.

An example of an ICP RF power delivery system 100 is depicted in FIG. 1, which utilizes n RF resonant power amplifiers 102 in connection with n ICP coils 104 where each of the ICP coils 104 is a portion of both, a corresponding RF resonant power amplifier 102 and an ICP source 101, and n is greater than or equal to 2. The RF resonant power amplifier 102 is a tuned RF power amplifier, realized in combination with the corresponding ICP coil 104 as its load, and it can be optimized to operate similar to a high-efficiency class E amplifier. As shown, each RF resonant power amplifier 102 comprises a switch network 106 and resonant tank 108. The switch network 106 may be realized by a single switch (as shown in FIG. 1) or multiple switches that function as a single switch (as shown in FIG. 10).

As shown, the collection of ICP coils 104 is inductively coupled via mutual coupling 107 (either passively between the coils themselves and/or through the plasma body), and the collection of ICP coils 104 drives a singular plasma body 109. Within the plasma body 109 control of power to each ICP coil provides a separate control over field uniformity, deposition uniformity, and/or etch uniformity.

Although not shown in the drawing figures, those of ordinary skill in the art will readily appreciate that the plasma body 109 may be contained in a plasma chamber, and the ICP coils 104 may be coupled to the chamber (e.g., to ignite and sustain the plasma body 109) in a variety of different configurations known to those of ordinary skill in the art. As shown, the resonant tank 108 includes a reactive network 110 that comprises at least one capacitive component such as one of, or both of, a series capacitance 112 and a parallel capacitance 114. The switching device technology of the switch or switches in the switch network 106 is not-essential (e.g., BJT, FET, silicon, Si—C, and GaN technology may be used), so long as the switch network 106 can be switched substantially fully on and off and the output capacitance characteristics of the switch network 106, combined with any required external parallel capacitance 114 in the reactive network 110, can create a resonant voltage waveform that will rise and then fall to substantially zero volts while the switch network 106 is off, and then (when the resonant voltage waveform is approximately zero volts) the switch network 106 is turned on. The series capacitance 112 can be physically a part of the RF resonant power amplifier 102, part of an assembly (including the corresponding RF resonant power amplifier 102 and corresponding ICP coil 104), or divided between.

Figure 2A:
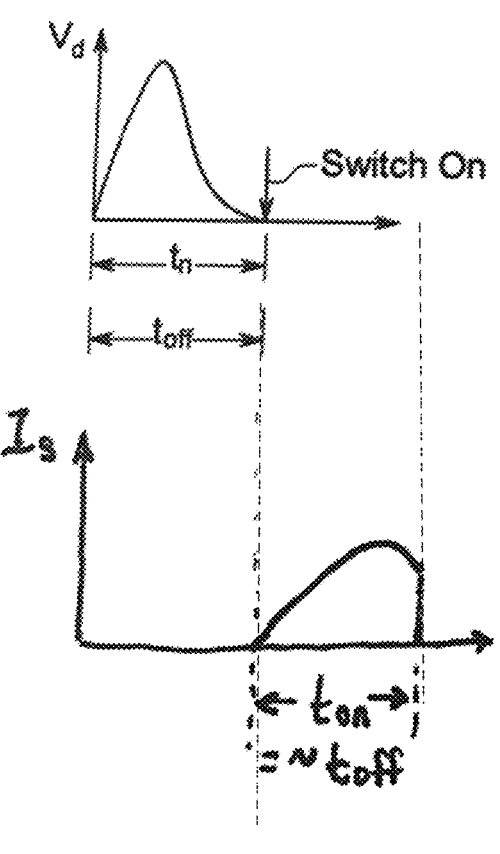
FIGS. 2A, 2B, and 2C are graphs depicting a resonant voltage waveform relative to switching time.
Figure 2B:
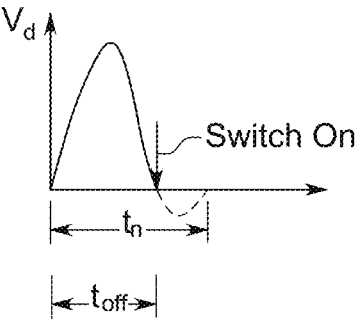
Figure 2C:
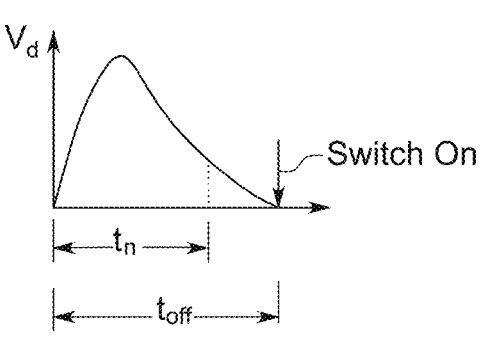

In the implementation depicted in FIG. 1, DC voltage sources 116 are implemented as variable voltage sources, but in other implementations discussed further herein, fixed output voltage DC power supplies in connection with DC/DC conversion (e.g., buck convertors) may be utilized. The simplified RF system depicted in FIG. 1 (and the other systems described herein) may vary its switching time until, as illustrated in FIGS. 2A, 2B, and 2C, the resonant voltage waveform, $V_d$, (shown at node 118 in FIG. 1 as $Vd_A$ and $Vd_B$) substantially equals zero, at which point, the switch network 106 is turned on (closed). The time that the switch network 106 is off, $t_{off}$, nominally equals one half-cycle of the instantaneous operating frequency of the RF resonant power amplifier 102, hence the frequency tuning time also equals nominally one-half cycle of the same operating frequency (e.g., a few tens of nanoseconds for typical ICP applications). This improvement in tuning speed may be appreciated by contrasting the tens of RF cycles (of embodiments disclosed herein) to several thousands of RF cycles of existing RF power architectures driving multiple ICP coils; thus, the tuning speed of the embodiments disclosed herein are many orders of magnitude faster than existing solutions.

As shown in FIGS. 2A-2C, the switch network 106 is nominally closed at a time, $t_n$. The time, $t_n$, is the time during which the switch network 106 would nominally be in an off state to effectuate an RF frequency at a "center" frequency of a frequency range for the RF resonant amplifier 102. As discussed above, and further herein, the time the switch network is off, $t_{off}$, is adjusted to maintain zero-voltage switching. As a consequence, $t_{off}$, may be shorter than $t_n$ in some instances (as shown in FIG. 2B), and $t_{off}$, may be longer than $t_n$ in other instances (as shown in FIG. 2C) to adjust the frequency (and hence, power) into the ICP coil 104. But regardless of the RF frequency that is effectuated at the ICP coil 104, in many modes of operation the switch network 106 is closed when the resonant voltage waveform, $V_d$, across the switch network 106 is substantially zero. But in some instances, aspects of the source load prevents the resonant voltage waveform, $V_d$, from reaching zero volts (at least within a viable amount of time), so in these instances, the switch network 106 is sub-optimally closed if a predetermined maximum time for $t_{off}$ is reached. For example, the predetermined maximum time may be established based upon calculations and/or an empirical assessment of the performance of the RF resonant power amplifier 102. This may be done to protect the RF resonant power amplifier 102 and/or to ensure the frequency range of one power amplifier does not overlap with a frequency range of another RF resonant power amplifier 102.

FIG. 2A also depicts current, $I_s$, through the switch network 106 during an RF cycle of the RF voltage waveform (realized by the combination of waveforms through the resonant tank 108) that is applied across the source load. The source load is comprised of the combination of each ICP coil 104, their mutual coupling between adjacent ICP coils 104 and into the plasma body 109, and the plasma load itself, which is depicted in FIG. 1 and FIGS. 3-8 in a simplified model as a resistor in series with each ICP coil 104. Although it is understood that each ICP coil 104 has its own internal resistance, both the desired and predominant power from the RF power delivery system is principally coupled into the bulk plasma or plasma body 109.

As shown, the resonant voltage waveform, $V_d$, across the switch network 106 rises (when the switch network 106 is in an open state) and then falls to substantially zero volts before the switch network 106 is closed (clamping the resonant voltage waveform, $V_d$ to zero volts) for a remainder of the RF cycle. In effect, the RF cycle of RF voltage waveform (applied to the source load) is forced to be roughly double the time needed to ring up the resonant voltage waveform, $V_d$ and return it again to zero (during $t_{off}$). As shown, the current, $I_s$, through the switch network 106 rises and falls during a second half of the RF cycle. It should be noted that the time, $t_{off}$, that the switch network 106 is off (open) may be approximately the same as the time, $t_{on}$, the switch network 106 is on (closed).

Figure 2D:
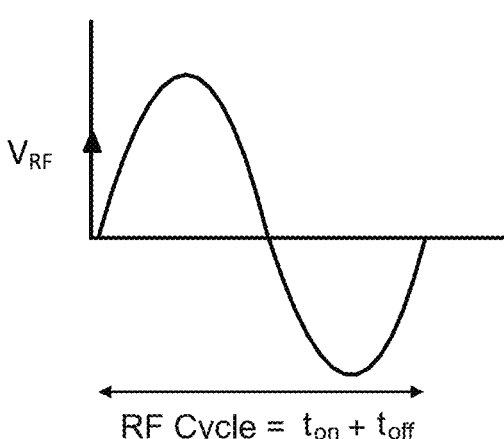
FIG. 2D is a graph depicting an example of a cycle of a voltage waveform applied to a source load that is effectuated by a resonant voltage waveform.

As shown in FIG. 2D, which depicts an example of an RF voltage waveform applied to the source load, each cycle of the RF voltage waveform is substantially equal to the time, $t_{on}$, that the switch network 106 is closed plus the time, $t_{off}$, the switch network 106 is open. Because $t_{on}$ is roughly equal to $t_{off}$, FIG. 2D further emphasizes that controlling when the switch network 106 is turned on controls the length of $t_{off}$, and hence, the length of the RF cycle of the RF voltage waveform.

In operation, each of the RF resonant power amplifiers 102 is tuned to operate over a different (e.g., non-overlapping) range of frequencies than the other RF resonant power amplifiers 102 connected to a common plasma body 109. In many implementations, the range of frequencies that each RF resonant power amplifier 102 operates across is no more than a ratio of 1.8:1 so that the highest frequency of a frequency range is no more than 1.8 times the lowest frequency of the range. As shown in FIG. 1, a first RF resonant power amplifier 102 may be tuned to operate at a center frequency, fa, and a second RF resonant power amplifier 102 may be tuned to operate at a center frequency, fb. Although referred to as "center" frequencies, fa and fb are not intended to be limited to a midpoint of a frequency range.

In some implementations, fa may be, for example and without limitation, about 13.56 MHz and fb may be about 27.12 MHz. In these implementations, the first RF resonant power amplifier 102 may operate over a range of 10.1 MHz to 18.2 MHz and the second RF resonant power amplifier 102 may operate over a range of 20.2 MHz to 36.3 MHz so that each frequency range is not overlapping. These frequencies and frequency ranges are only examples, and other narrower frequency ranges and other "center" frequencies may be utilized. For example, the first RF resonant power amplifier 102 may operate over a range of 11.56 MHz to 15.56 MHz and the second RF resonant power amplifier 102 may operate over a range of 25.12 MHz to 29.12 MHz, and a third RF resonant power amplifier 102 (not shown) may operate over a range of 1.8 MHz to 2.2 MHz.

To substantially eliminate switching losses, the switch network 106 is switched on (closed) at substantially zero volts. With no to low switching losses in the primary switch network 106, the predominant power loss mechanism in the RF resonant power amplifier 102 is only the internal resistance of the one or more switching devices (in the switch network 106) when the switch network 106 is turned on. The internal resistance of the switching device(s) is determined by the properties of the device channel of each switching device, and this loss mechanism is substantially independent across the range of operating frequencies. As a consequence, in the simplest implementation, power regulation of each of the RF resonant power amplifiers 102 into a corresponding ICP coil 104 may be based on the output power of the corresponding DC voltage source 116, which is the product of the DC voltage of the DC voltage source 116 and its output current. This product is substantially proportional to the RF power driving the ICP coil 104 corresponding to the DC voltage source 116. Alternatively, as discussed further herein, the system can be regulated from the output RF current driving the ICP coil 104 or the RF power measured at node 120, although this would require an additional RF sensor placed at the output of the simplified RF system, including its resulting costs/complexities.

Figure 3:
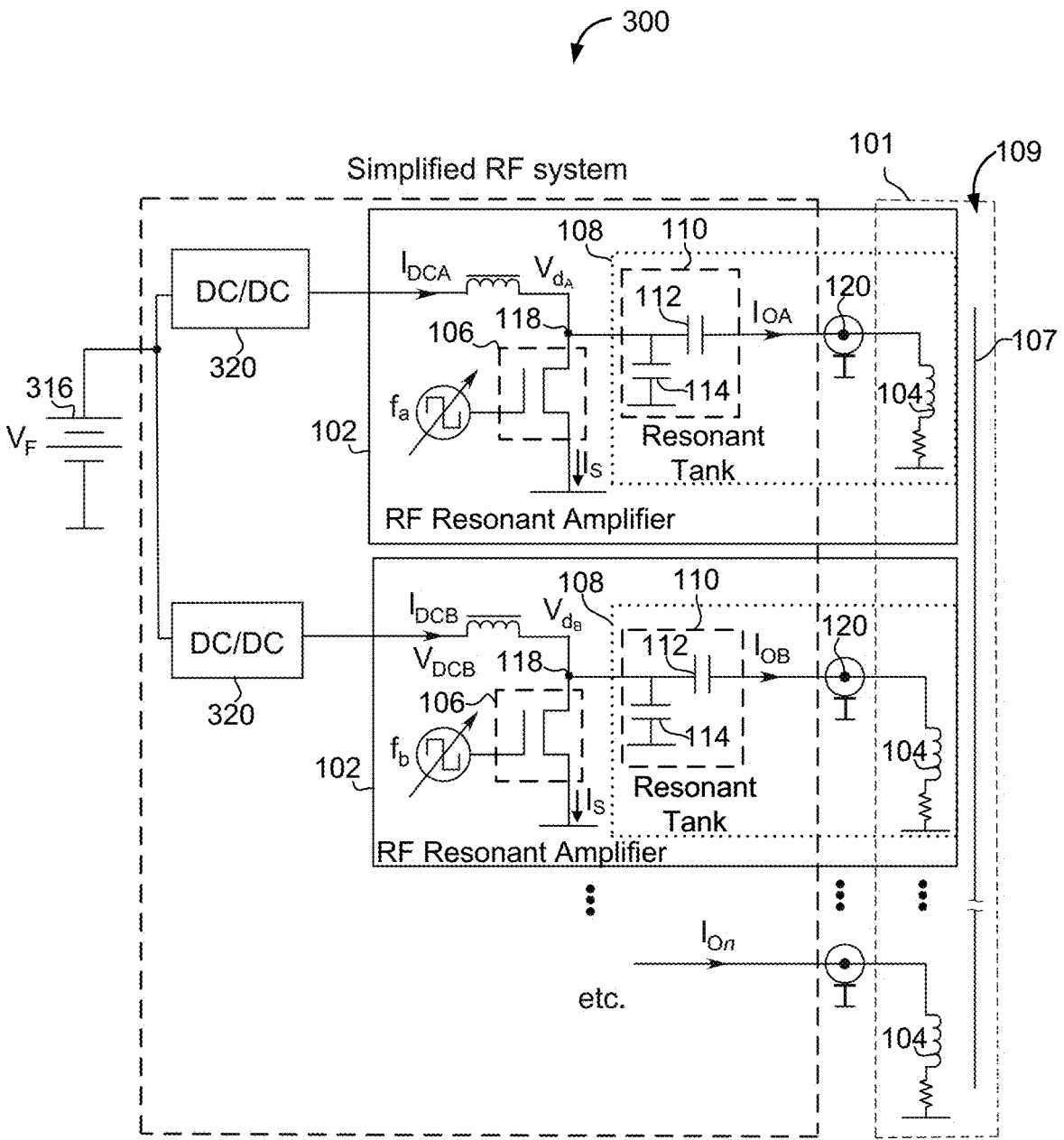
FIG. 3 is a schematic representation of another example of an ICP power delivery system.

Referring to FIG. 3, shown is another example of an ICP RF power delivery system 300 that utilizes a fixed DC voltage source 316 to apply power to n DC/DC converters 320 (where n is greater than or equal to 2), and each of the n DC/DC converters 320 is coupled to a corresponding one of n RF resonant power amplifiers 102, and in turn, each of the n RF resonant power amplifiers 102 is coupled to one of n ICP coils 104. Each of the DC/DC converters 320 may be separately controlled to regulate the DC voltage in each branch of the system (where each branch comprises a DC/DC converter 320, RF resonant power amplifier 102, and an ICP coil 104). In the system depicted in FIG. 3, each DC/DC converter 320 operates as a DC voltage source with inputs driven by the fixed voltage source 316.

Beneficially, the fixed DC voltage source 316 may be remotely located from the plasma chamber and simplified RF resonant power amplifiers 102 and their corresponding DC/DC converters 320 may be implemented in close connection with the plasma chamber. The reduced complexity of on-tool RF systems allows multiple like-solutions to be packaged together to drive an integrated, multi-coil ICP source. With sufficient separation between source frequencies from each of the separate RF resonant power amplifiers 102, controllable power and current may be used to influence field/deposition/etch uniformity.

Figure 4:
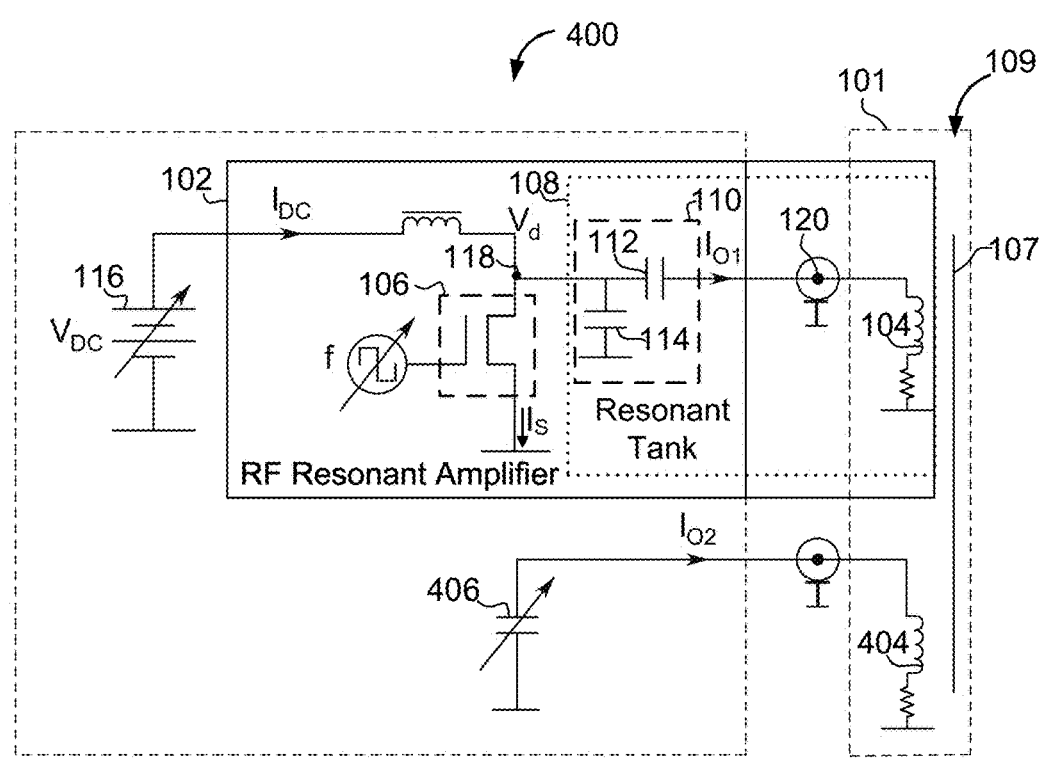
FIG. 4 is a schematic representation of yet another example of an ICP power delivery system.

Turning to FIG. 4, shown is yet another ICP RF power delivery system 400, which comprises both (a driven) ICP coil 104 a passive ICP coil 404. As shown, the passive ICP 404 coil may be terminated by an adjustable impedance 406 (shown as a variable capacitor in FIGS. 4, 5, and 8) to enable control over the current through the passive ICP coil 404, which is inductively coupled from the primary RF powered ICP coil 104 through the plasma. Although a single passive ICP coil 404 is depicted in FIG. 4, there may be multiple undriven ICP coils 404. As described further herein, regulation of any differences of current between the multiple passive ICP coils 404 may be effectuated by accurate measurement and control of current through each passive ICP coil 404. For example, the adjustable terminating impedance 406 may be adjusted to control field/deposition/ etch uniformity (or any desired nonuniformity).

Figure 5:
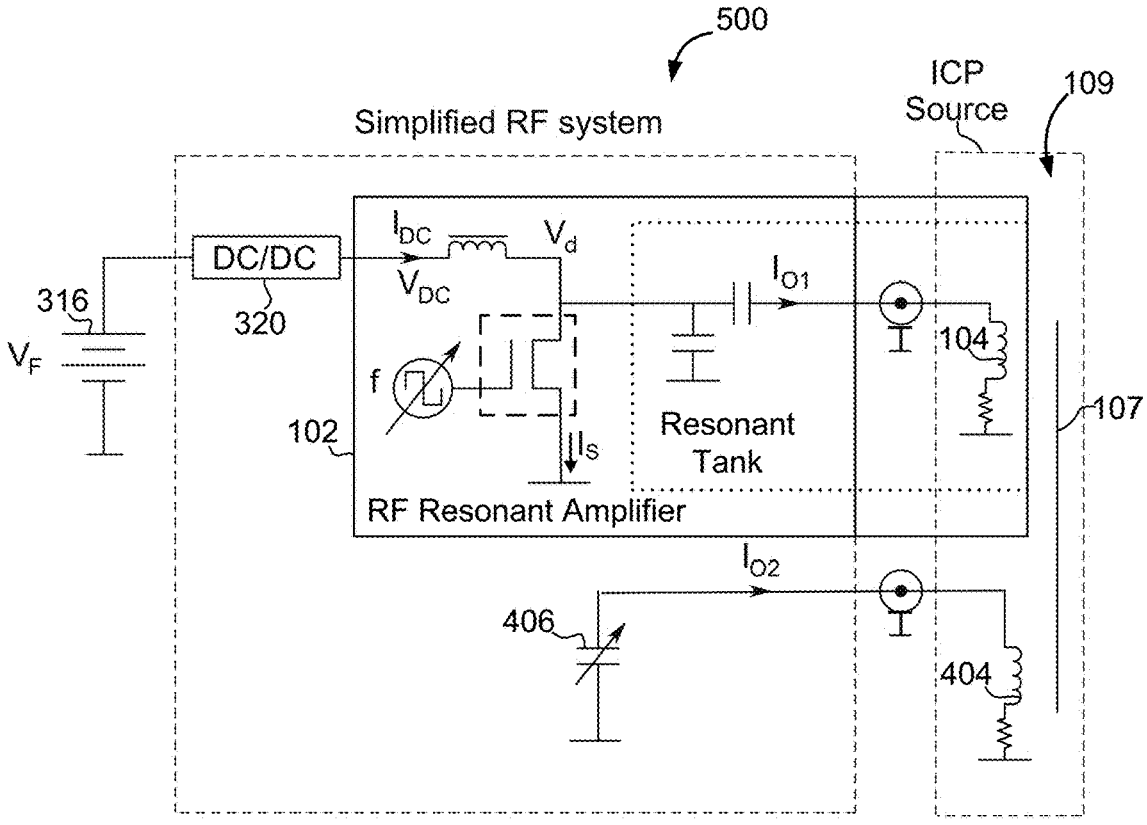
FIG. 5 is a schematic representation of yet another example of an ICP power delivery system.

FIG. 5 depicts another ICP RF power delivery system 500 that comprises both a driven ICP coil 104 and a passive ICP coil 404. As shown, the system depicted in FIG. 5 operates in much the same way as the system in FIG. 4 except that the system in FIG. 5 comprises a DC/DC converter 320 (with inputs driven by the fixed voltage source 316) that functions as a DC voltage source. The fixed DC voltage source 316 may be remotely located from the RF resonant power amplifier 102 or integrated with the RF resonant power amplifier 102.

Implementations that utilize a fixed DC source (such as those depicted in FIGS. 3 and 5) may implement the fixed DC source remotely from the plasma chamber; thus, reducing complexity for tool-mounted solutions by allowing localized DC voltage regulation (e.g., buck conversion) from each separate RF resonant power amplifier 102.

Beneficially, the several variations of power delivery systems disclosed herein enable a significant reduction in cost and complexity of on-tool RF systems. It is unnecessary to match the impedance of the RF resonant power amplifiers 102 to 50 ohms and non-essential harmonic attenuation may be avoided when powering ICP loads. Neither a match network nor attenuation is essential/necessary in many of the implementations disclosed herein. In addition, the depicted RF resonant power amplifiers 102 may be simplified to exclude an on-board resonant tank circuit, as this function is realized by affirmatively utilizing the ICP coil 104 as part of the resonant tank 108.

Frequency operation is set by utilizing zero-voltage switching, thereby eliminating the requirement for a frequency tuning algorithm. As such, the frequency "tune time" in this implementation may be considered to nominally equal half the primary RF operating frequency cycle (e.g., half a cycle of $f_a$ or $f_b$). And with zero-voltage switching, the primary loss mechanism between the PA switching device and the reactive network is the resistance of the switching device, and these losses are largely independent of the operating frequency within the frequency range. This enables a simplification of control over power delivery into the ICP loads due to its proportionality to the product of DC voltage and current sourced to the PA.

Figure 6:
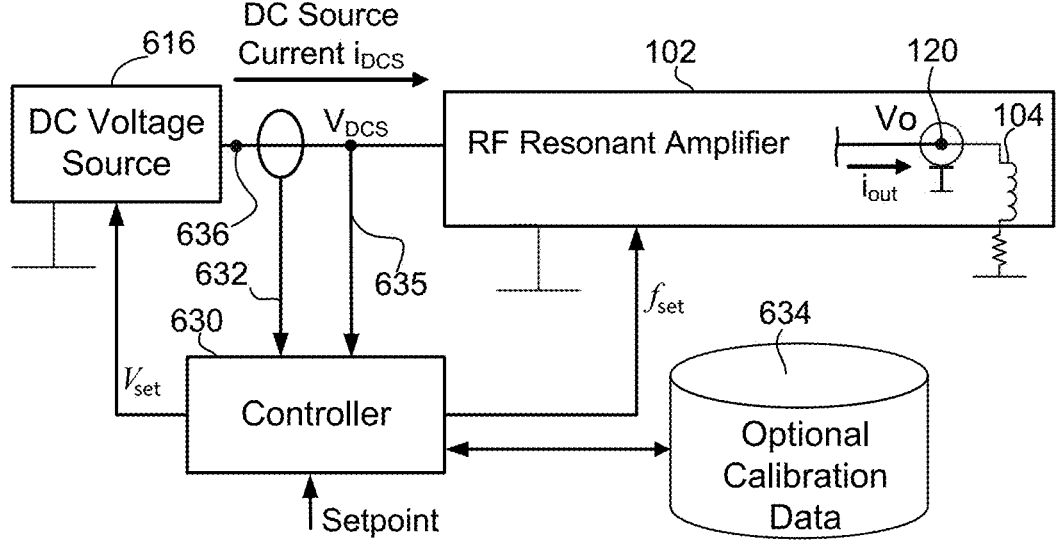
FIG. 6 is a block diagram depicting an example of one approach to controlling power applied to directly driven ICP coils.

Referring to FIG. 6, for example, shown is an implementation in which power applied to an ICP coil 104 is regulated based upon a voltage, $V_{DCS}$, at the output of the DC voltage source 616 and current, $i_{DCS}$, at the output of the DC voltage source 616. More specifically, to regulate power applied to the ICP coil 104, a controller 630 may simultaneously vary a voltage setpoint, $V_{set}$, of the DC voltage source 616 (to vary $V_{DCS}$ and control power that is applied to the ICP coil) and a frequency setpoint, $f_{set}$, of the RF resonant power amplifier 102 (to vary an operating frequency into the ICP coil to maintain zero-voltage switching) based upon a product of a sensed current 632 and a sensed voltage 635 at the output of the DC voltage source 616. Those of ordinary skill in the art, in view of this disclosure, will recognize that adjusting the DC voltage of the DC voltage source 616 may be used to adjust power applied to the ICP coil 104 and that as the frequency is adjusted (e.g., by adjusting $t_{off}$) to maintain zero voltage switching, the power applied by the RF resonant amplifier 102 may change, which prompts a readjustment the DC voltage of the DC voltage source 616 to compensate. It should be recognized that only a single branch (comprising a single RF resonant power amplifier 102 and a single ICP coil 104) is depicted for purposes of simplicity and clarity, but in actual implementation, two or more branches are controlled in the same way (by one or more controllers 630) so that each branch may be tuned to operate at a different power level and over a different range of frequencies than the other branches that are coupled to the common plasma.

As discussed above, by virtue of the switching device losses (of the switch network 106) being the predominant less mechanism between the switching device and the reactive network, the actual power applied to the ICP coil 104 is substantially proportional to the DC power applied at an output 636 of the DC voltage source 616. But there are still losses in each branch that render the actual power applied to the ICP coil 104 different than the power applied at the output 636 of the DC voltage source. As a consequence, optional calibration data 634 may be used by the controller to scale the measured power at the output 636 so that the scaled version of the measured power is substantially the same as the actual power applied to the ICP coil 104. Those of ordinary skill in the art will appreciate that the optional calibration data 634 may be obtained by using precision metrology instruments to measure the actual power applied to the ICP coil 104 to obtain one or more adjustment factors or an equation that can be used to adjust the power measured at the output 636 so that it is substantially the same as the power actually applied to the ICP coil 104.

Figure 7:
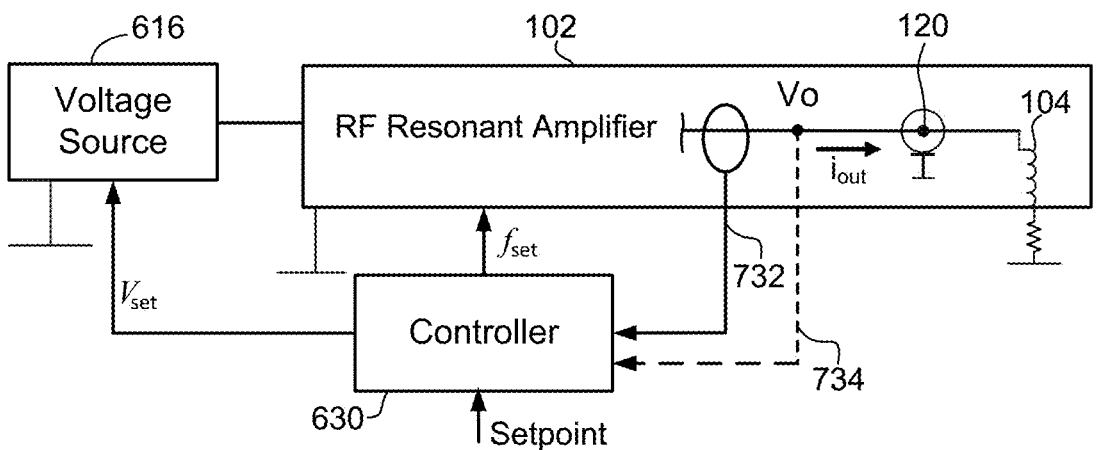
FIG. 7 is a block diagram depicting another example of an approach to controlling power applied to directly driven ICP coils.

Alternatively, regulating on output current, as opposed to power measured directly at the output, also reduces complexity and enables improved repeatability. Referring to FIG. 7, for example, shown is a control configuration that regulates current applied to the ICP coil 104 based on a sensed current 732 (indicative of output current, $i_{out}$). As shown, a sensed voltage 734 (indicative of the RF voltage waveform, Vo, applied to the ICP coil 104) may also be optionally measured and used (in conjunction with the output current $i_{out}$) to regulate power that is applied to the ICP coil 104.

Figure 8:
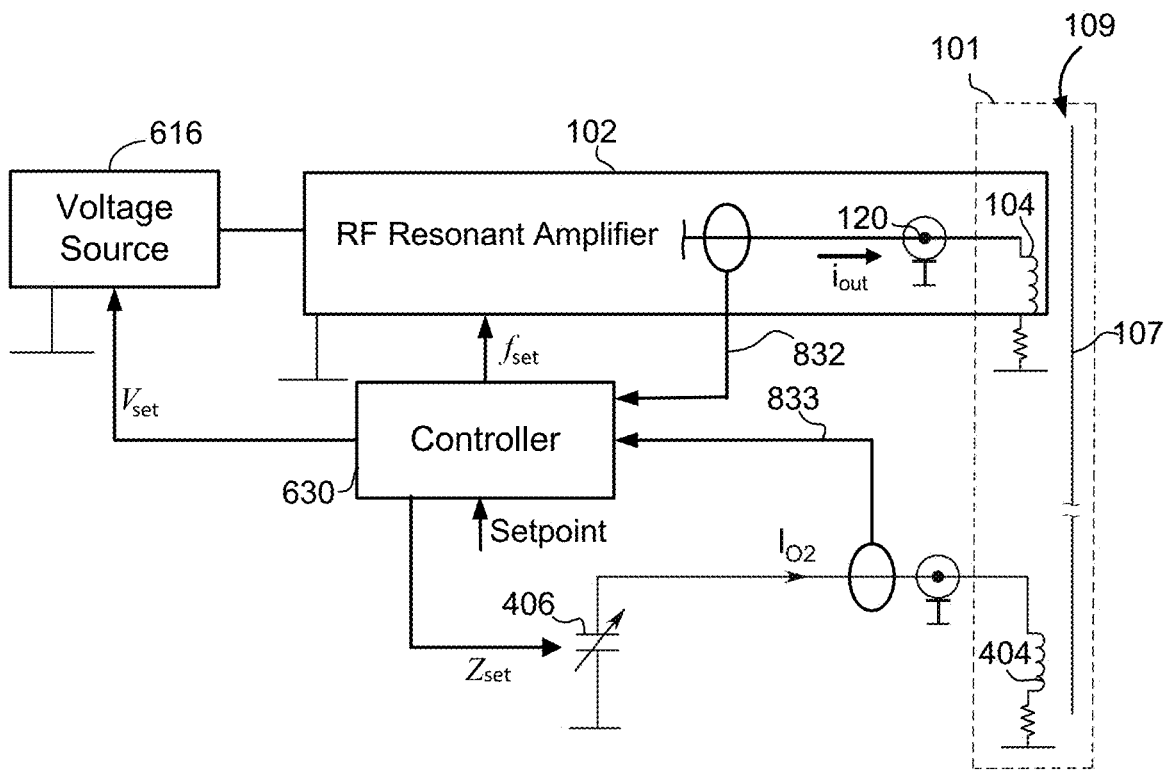
FIG. 8 is a block diagram depicting an example of an approach to controlling power applied to a directly driven ICP coil and a passive ICP coil.

As discussed above with reference to FIGS. 4 and 5, driving a multi-element ICP source with even a single RF resonant power amplifier 102 can be complemented with passive adjustment of a termination impedance connected to undriven ICP coils 404. This allows the same frequency to couple controllable currents into the adjacent coils through the common plasma to influence field/deposition/etch uniformity. Referring to FIG. 8, shown is a block diagram depicting aspects of control in a system that includes both a first (direct driven) ICP coil 104 and a passive ICP coil 404. As shown, the controller 630 may receive a sensed-current signal 832 via a current sensor to sense current, $i_{out}$, that flows through the direct driven ICP coil 104 and receive a sensed-current signal 833 via a current sensor that is positioned to sense current, $I_{O2}$, that flows through the adjustable impedance 406 and the passive ICP coil 404. In response, the controller 630 may control the current, $I_{O2}$, into the passive ICP coil 404 by adjusting the termination impedance. In addition, similar to other embodiments discussed herein, the controller 630 is configured to control power applied to the direct driven ICP coil 104 by varying the DC voltage source 616 and simultaneously varying an operating frequency into the first ICP coil 104 by allowing a resonant voltage waveform across an open state of the switch network 106 to rise and then fall to substantially zero volts before closing the switch network to complete an RF cycle.

The controller 630 may be implemented directly in hardware, in one or more software modules executed by a processor, or in a combination of the two. A software module may reside as non-transitory processor executable instructions in non-volatile memory, which is coupled to the processor so the processor can read information from, and write information to, the non-volatile memory. The steps of the methods described above may be implemented as processor-executable instructions stored in the non-volatile memory, and the optional calibration data 634 may be stored in non-volatile memory (which may be distributed among several memory components). The processor may be a general-purpose processor, a digital signal processor (DSP), an application specific integrated circuit (ASIC), a field programmable gate array (FPGA) and/or other programmable logic device, discrete gate or transistor logic, discrete hardware components, or any combination thereof designed to perform the functions described herein.

Figure 9:
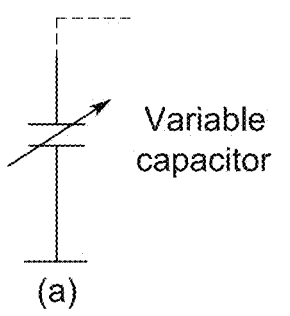
FIG. 9 depicts variations of the types of variable impedance that may be utilized as the terminating impedance of FIGS. 4, 5, and 8.
Figure 9:
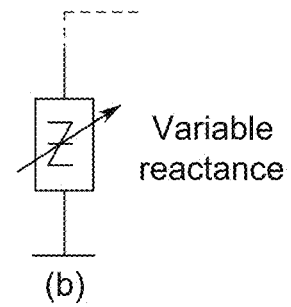
Figure 9:
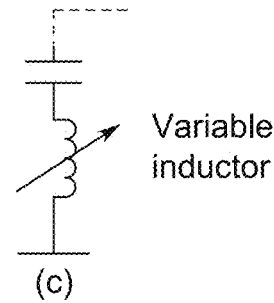

FIG. 9 depicts variations of the types of adjustable impedance 406 that may be utilized as the terminating impedance (for the passive ICP coils) in the embodiments depicted in FIGS. 4, 5, and 8. As shown, the adjustable impedance 406 may be realized by a variable capacitor, a variable inductor, or a variable reactance.

FIG. 10 depicts a switch network 1006 (that is one example of the switch network 106), which comprises a plurality of series-arranged switches that are operated to function as a single switch. More specifically, all of the series-arranged switches in the switch network 1006 are simultaneously opened when the switched network is off or open, and all of the series-arranged switches in the switch network 1006 are simultaneously closed when the switched network is on or closed. Those of ordinary skill in the art will readily appreciate, in view of this disclosure, that other types of switch networks may be implemented. For example, two parallel switches may replace any of the single switch devices depicted herein (e.g., to allow for higher current flow with lower-current-rated switch devices) and may open and close simultaneously to operate as a single switch.

Figure 11A:
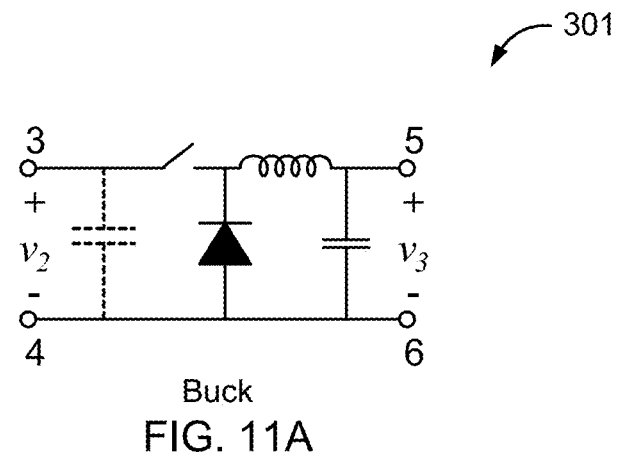
FIGS. 11A, 11B, and 11C are schematic diagrams depicting simplified examples of a buck converter, a boost converter, and a buck-boost converter, respectively.
Figure 11B:
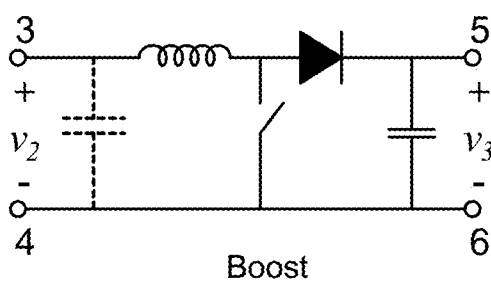
Figure 11C:
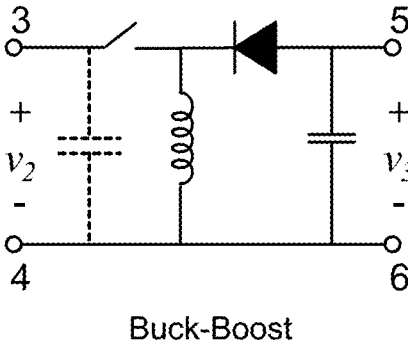

FIGS. 11A, 11B, and 11C each depict an example of the DC/DC converter 320. More specifically, FIG. 11A depicts an example of a simplified buck converter; FIG. 11B depicts an example of a simplified boost converter; and FIG. 11C depicts an example of a simplified buck-boost converter. Those of ordinary skill in the art will readily appreciate, in view of this disclosure, that other topologies may be utilized for the types of DC/DC converters depicted in FIGS. 11A-11C.

Disclosed herein are a variety of different embodiments and implementation designs. It should be recognized that the constituent components of the RF resonant power amplifiers 102 including the ICP coils 104, 404 may be integrated into a unitary system or may be distributed among separable components. When distributed, for example, the RF resonant power amplifiers 102 and the voltage sources 116, 316 may be separable components (and sold and distributed separately from) the ICP coils 104 and plasma chamber. It is further contemplated that the RF resonant power amplifiers 102 including the ICP coils 104, 404 may be physically integrated with a plasma chamber and sold a distributed as an integrated ICP source.

As used herein, the recitation of "at least one of A, B and C" or "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A power delivery system, comprising:
   a voltage source;
   an amplifier coupled to a first node and the voltage source, the amplifier comprising a reactive network configured to form a resonant circuit when the first node is coupled to a coil;
   an impedance coupled to a second node;
   a controller configured to:
   control power to the first node by varying the voltage source; and
   control power to the second node by adjusting the impedance.

2. The power delivery system of claim 1, wherein the amplifier comprises a switch network coupled to the voltage source, wherein the controller is configured to vary a frequency at the first node by allowing a voltage across the switch network in an open state to rise and then fall before closing the switch network.

3. The power delivery system of claim 2, wherein the frequency is adjusted to achieve zero-voltage switching while maintaining resonance with the resonant circuit.

4. The power delivery system of claim 2, wherein the switch network comprises one of a single physical switch or a plurality of switches that operate as a single switch.

5. The power delivery system of claim 1, wherein the impedance comprises at least one of a variable capacitor, variable reactance, and a variable inductor.

6. The power delivery system of claim 1, wherein current into the first node is regulated by measuring the current into the first node.

7. The power delivery system of claim 1 wherein the voltage source comprises a DC/DC converter with an input driven by a fixed DC voltage source.

8. The power delivery system of claim 7, wherein the DC/DC converter comprises one of a buck converter, boost converter, or buck-boost converter.

9. The power delivery system of claim 1, wherein the reactive network comprises one of a series capacitor, a parallel capacitor, or a series and a parallel capacitor.

10. A method for power delivery comprising:
    creating a resonant circuit by coupling an amplifier to first coil;
    inductively coupling power from the first coil to a second coil;
    controlling power to the first coil by adjusting a voltage applied to the amplifier; and
    controlling the power inductively coupled to the second coil by adjusting an impedance that is coupled to the second coil.

11. The method of claim 10, wherein the coupling the amplifier to first coil comprises coupling the amplifier to the first coil without a match network.

12. The method of claim 11, wherein the coupling includes mechanically coupling the amplifier to a plasma chamber.

13. The method of claim 12, comprising coupling a DC/DC power converter to the amplifier and providing a voltage to the DC/DC power converter from a remotely located fixed voltage source.

14. The method of claim 10 comprising:

controlling a frequency of the amplifier by adjusting the frequency of the amplifier to achieve zero-voltage switching.

15. The method of claim 10, wherein power regulation into the first coil is controlled by a product of a voltage applied to the amplifier and current provided to the first coil.

16. A power delivery system comprising:

a first branch comprising a first voltage source and a first amplifier;

a second branch comprising a second voltage source and a second amplifier; and at least one controller configured to:

maintain a different frequency for the first amplifier than a frequency of the second amplifier;

control power of the first amplifier by varying the first voltage source; and control power of the second amplifier by varying the second voltage source.

17. The power delivery system of claim 16 wherein each of the first and second voltage sources includes a DC/DC converter with inputs driven by a fixed DC voltage source.

18. The power delivery system of claim 17, wherein each DC/DC converter comprises one of a buck converter, boost converter, or buck-boost converter.

19. The power delivery system of claim 18, wherein the at least one controller is configured to:

regulate current provided by the first amplifier by regulating current provided by the first amplifier; and regulate current provided by the second amplifier by regulating current provided by the second amplifier.

20. The power delivery system of claim 18 wherein the at least one controller is configured to:

regulate power provided by the first amplifier by regulating power provided by the first amplifier; and regulate power provided by the second amplifier by regulating power provided by the second amplifier.

* * * * *